US009330819B2

(12) United States Patent
Schlenga

(10) Patent No.: US 9,330,819 B2
(45) Date of Patent: May 3, 2016

(54) SEMI-FINISHED WIRE FOR A NB3SN SUPERCONDUCTING WIRE

(71) Applicant: Bruker EAS GmbH, Hanau (DE)

(72) Inventor: Klaus Schlenga, Linkenheim-Hochstetten (DE)

(73) Assignee: Bruker EAS GmbH, Hanau (DE)

(*) Notice: Subject to any disclaimer, the term of this patent is extended or adjusted under 35 U.S.C. 154(b) by 273 days.

(21) Appl. No.: 14/043,865

(22) Filed: Oct. 2, 2013

(65) Prior Publication Data

US 2014/0096997 A1 Apr. 10, 2014

(30) Foreign Application Priority Data

Oct. 5, 2012 (DE) ......................... 10 2012 218 222

(51) Int. Cl.

*H01B 12/00* (2006.01)
*H01B 13/00* (2006.01)
*H01L 39/12* (2006.01)
*H01L 39/24* (2006.01)

(52) U.S. Cl.

CPC ................ *H01B 12/00* (2013.01); *H01B 13/00* (2013.01); *H01L 39/12* (2013.01); *H01L 39/2409* (2013.01); *Y10T 29/49014* (2015.01)

(58) Field of Classification Search

CPC ........ H01B 12/00; H01B 13/00; H01L 39/12; H01L 39/2409; Y10T 29/49014
USPC ........................................... 174/125.1, 126.2
See application file for complete search history.

(56) References Cited

U.S. PATENT DOCUMENTS 4,757,161 A 7/1988 Wilhelm
7,368,021 B2 5/2008 Field
2005/0178472 A1* 8/2005 Hong .................... B21C 37/047 148/98
2006/0081307 A1* 4/2006 Field et al. ...................... 148/98
2008/0167192 A1* 7/2008 Kato ................... H01L 39/2409 505/230
2008/0274903 A1* 11/2008 Field ................... H01L 39/2409 505/431
2009/0036312 A1* 2/2009 Thoener .................. H01L 39/14 505/231
2009/0038822 A1* 2/2009 Thoener .................. H01L 39/14 174/125.1
2010/0031493 A1* 2/2010 Motowidlo ......... H01L 39/2409 29/599
2010/0093546 A1* 4/2010 Schlenga .............. H01L 39/141 505/231
2011/0136672 A1* 6/2011 Buta ................... H01L 39/2403 505/230
2011/0190139 A1* 8/2011 Ohata .................... H01B 12/04 505/230
2012/0108437 A1* 5/2012 Ohata ................. H01L 39/2409 505/231
2012/0149579 A1* 6/2012 Wadayama ......... H01L 39/2409 505/211
2013/0053250 A1* 2/2013 Ohata ................. H01L 39/2409 505/231

FOREIGN PATENT DOCUMENTS

DE 10 2004 056 905 7/2005

* cited by examiner

*Primary Examiner* — Hoa C Nguyen
*Assistant Examiner* — Amol Patel
(74) *Attorney, Agent, or Firm* — Paul Vincent

(57) ABSTRACT

A semi-finished wire (1) for a $Nb_3Sn$ superconducting wire (45) has a multiplicity of elements containing Nb packed against each other (6). The elements containing Nb (6) each have a rod containing Nb (7) and an enclosure containing Cu (8) surrounding the latter. The semi-finished wire also has a structure containing Sn (5) and a matrix containing Cu (4) in which the structure containing Sn (5) is disposed and on and/or in which the elements containing Nb (6) are disposed. The enclosures containing Cu (8) of the elements containing Nb (6), contain Sn. The semi-finished wire is suitable for manufacturing an $Nb_3Sn$ superconducting wire with which further improved superconducting current-carrying capacity is achieved.

20 Claims, 4 Drawing Sheets

Figure 1:
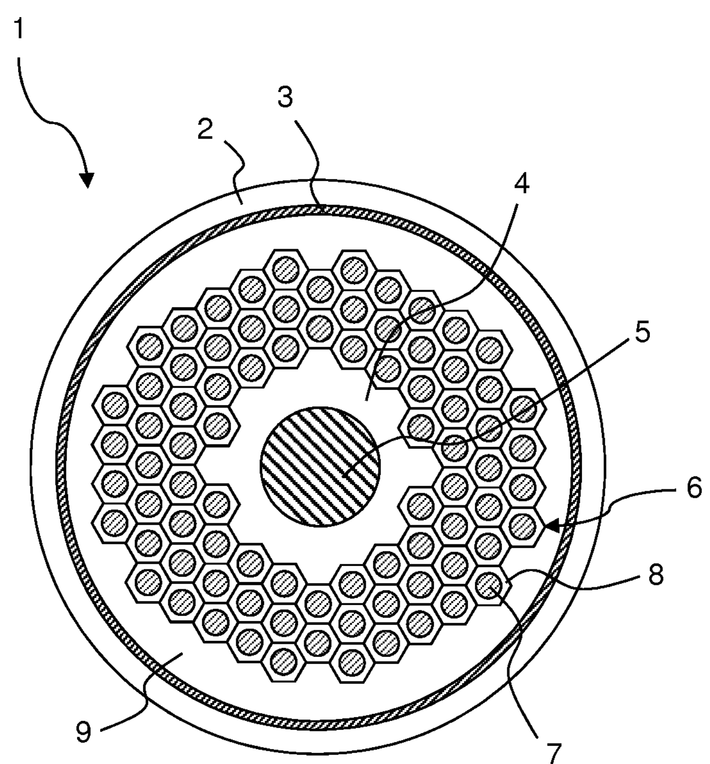

1
2
3
4
5
6
8
9
7

SEMI-FINISHED WIRE FOR A NB3SN SUPERCONDUCTING WIRE

The invention relates to a semi-finished wire for a $Nb_3Sn$ superconducting wire, wherein the semi-finished wire comprises

- a multiplicity of elements containing Nb packed against each other, wherein the elements containing Nb each have a rod containing Nb and an enclosure containing Cu surrounding the latter,
- a structure containing Sn,
- and a matrix containing Cu, in which the structure containing Sn is disposed and on and/or in which the elements containing Nb are disposed.

Such a semi-finished wire is disclosed in U.S. Pat. No. 7,368,021 B2.

$Nb_3Sn$ is a superconducting material, commonly used in particular for manufacturing superconducting magnet coils. $Nb_3Sn$ superconducting wires achieve considerably higher current densities than other metallic low-temperature superconducting materials (such as NbTi). However, the manufacture and processing of $Nb_3Sn$ superconducting wires is difficult, as $Nb_3Sn$ is a relatively brittle material and therefore cannot (or only to a minimal degree) be plastically deformed.

Forming processes such as wire drawing are therefore performed on semi-finished products comprising Nb filaments or filaments containing Nb and Sn (alloyed or unalloyed). The semi-finished wire, or alternatively a bundle of semi-finished wires, is laid according to the desired superconducting wire configuration (for example, wound into a coil) and subsequently subjected to reaction heat treatment, during which the in (Sn) contained in the semi-finished wire reacts with the niobium (Nb) contained in the filaments to form $Nb_3Sn$. After the reaction heat treatment, the finished superconducting wire is ideally not plastically deformed any further.

For the production of $Nb_3Sn$, in particular, the so-called "bronze route" and "internal tin diffusion" have been disclosed. In the bronze route, Nb filaments are embedded in a bronze matrix (bronze: alloy of Cu and Sn), and, during reaction heat treatment, the in contained in the bronze reacts at least partially with the niobium of the filaments. In practice, the bronze route is easy to implement. During internal in diffusion (until final heat treatment), a in source, which is separate from the copper (Cu), is present in the semi-finished wire, wherein large quantities of in can be made available and thus large cross-sectional proportions of $Nb_3Sn$ can be ensured in the finished $Nb_3Sn$ superconducting wire. Such a superconducting wire can achieve very high current-carrying capacities. However, handling of the semi-finished wire is rendered difficult by the very soft in (as compared with copper).

U.S. Pat. No. 7,368,021 B2, in particular FIG. 3, discloses a semi-finished wire in which copper-enclosed Nb rods are densely packed against each other and disposed in a copper matrix. The semi-finished wire has a central in core. During reaction heat treatment, the in diffuses out of the in core through the copper matrix to the Nb rods. The casings of the Nb rods made of copper also provide diffusion paths for the in to the peripheral Nb rods (not bordering the copper matrix), so that these Nb rods can also be converted to $Nb_3Sn$. In this way, a $Nb_3Sn$ wire with a high superconducting current-carrying capacity can be manufactured.

Figure 4:
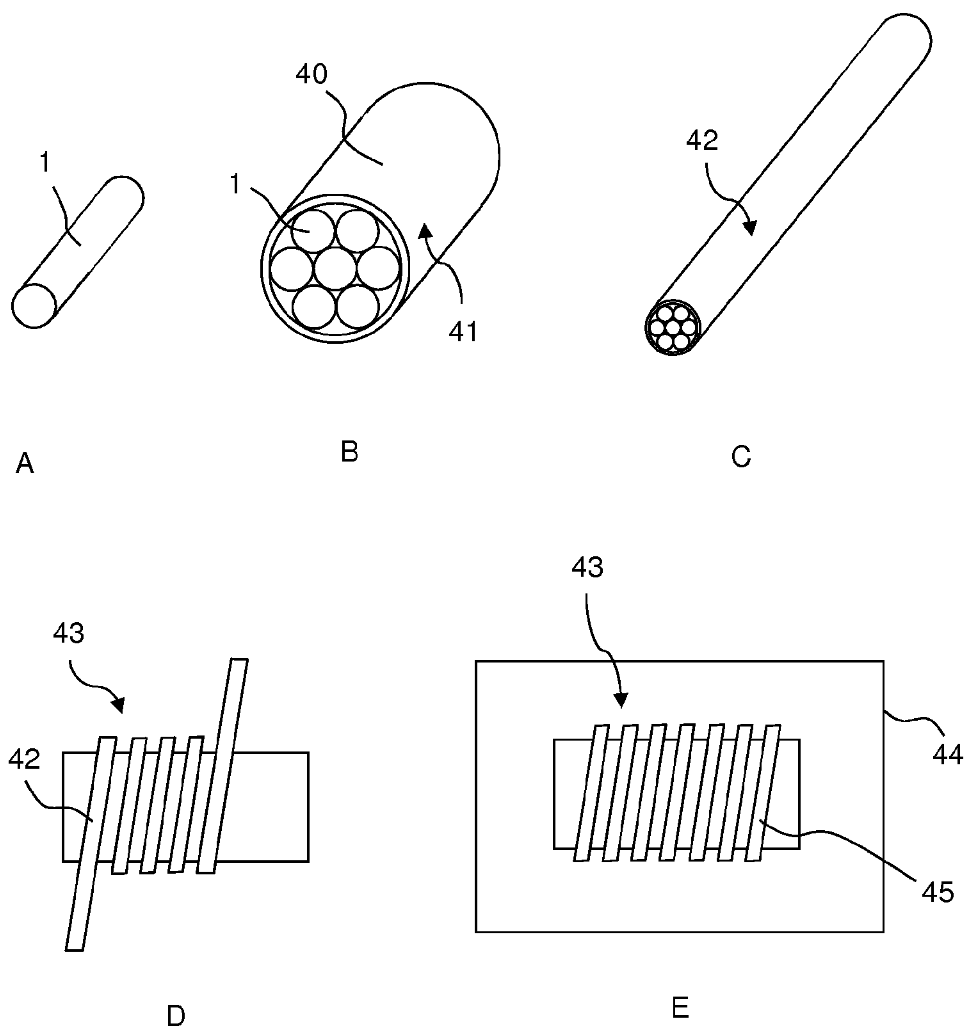

EP 0 223 137 A1, in particular, FIG. 4, discloses a semi-finished wire with a Sn core, a bronze matrix surrounding the latter and Nb filaments disposed distributed throughout the bronze matrix.

OBJECT OF THE INVENTION

The object of the invention is to provide a semi-finished wire for manufacturing a $Nb_3Sn$ superconducting wire, with which further improved superconducting current-carrying capacity can be achieved.

SHORT DESCRIPTION OF THE INVENTION

This object is achieved with a semi-finished wire of the type mentioned above, characterized in that the enclosures containing Cu of the elements containing Nb contain Sn.

According to the invention, a semi-finished wire (semi-product for short) is provided in which Sn is contained in the enclosures containing Cu of the elements containing Nb even before reaction heat treatment starts. Typically, as part of the manufacture of the semi-finished wire, Nb rods were inserted for this purpose into tubes that contain Cu and inventively also Sn (these are the subsequent enclosures containing Cu), or the Nb rods and the enclosures containing Cu were jointly extruded, wherein the enclosures containing Cu had already been extruded with Sn contained in them. The tubes filled in this way and/or the extruded rods were then included in the manufacture of the semi-finished wire as elements containing Nb, in particular, disposed on or in the matrix containing Cu, and typically inserted into a Cu enclosing tube. If necessary, one or more bundling or drawing steps can be performed. The semi-finished wire can then finally be laid in any desired shape, for example, wound as a coil, and subsequently subjected to reaction heat treatment.

As part of the subsequent reaction heat treatment of the inventive semi-finished wire, Sn largely diffuses from the structure containing Sn through the matrix containing Cu and the enclosures containing Cu to the Nb rods in order to form $Nb_3Sn$. Because, according to the invention, the enclosures containing Cu of the elements containing Nb also contain Sn, as part of the reaction heat treatment, Sn can reach the Nb rods considerably faster than in the case of enclosures containing Cu, which initially contain no Sn.

According to the invention, the elements containing Nb are packed against each other. Packed against each other means that the enclosures containing Cu of the elements containing Nb make mutual contact, preferably, over a large surface area. The elements containing Nb can be disposed packed against each other in one or (more rarely) in multiple groups. Because the elements containing Nb are disposed packed against each other, a subset of the elements containing Nb is separated by other elements containing Nb from the matrix containing Cu (i.e. the elements containing Nb of this subset are not contiguous with the matrix containing Cu).

The enclosures containing Cu are the only routes through which the elements containing Nb that are not contiguous with matrix containing Cu (but disposed inside) can receive Sn from the structure containing Sn. As long as the enclosures containing Cu have not yet been enriched with Sn, conversion to $Nb_3Sn$ of the Nb rods of elements containing Nb that are not contiguous with the matrix containing Cu is not possible. The enclosures containing Cu only have a small cross-sectional thickness (perpendicular to the longitudinal extension of the semi-finished wire), which can additionally hamper diffusion of Sn into the enclosures.

Due to the enclosures containing Cu which inventively also contain Sn, these routes are already enriched with Sn at the beginning of the reaction heat treatment and can therefore be immediately used as Sn diffusion paths; it is not necessary to wait for penetration with Sn via the matrix containing Cu. Accordingly, the formation of $Nb_3Sn$ can begin very early on after heat treatment has started and occur very quickly, even for elements containing Nb that are disposed at a distance from the matrix containing Cu (i.e. not contiguous with the matrix containing Cu).

Due to the early start and high efficiency of the formation of $Nb_3Sn$, reaction heat treatment takes a relatively short time. Accordingly, the growth of $Nb_3Sn$ grains only progresses slowly during reaction heat treatment, so that relatively small $Nb_3Sn$ grains result. Small grain sizes have a larger grain interface (i.e. a larger grain interface density), which is responsible for fixing flux tubes ("flux pinning"). Accordingly, within the scope of the invention, a very high critical flux density and a very high critical current of the superconducting wire manufactured from the semi-finished wire can be achieved.

By using a multiplicity of contiguous elements containing Nb, basically any proportions of the cross-sectional area of the semi-finished wire can be filled with Nb; equally, any proportion of Sn in the cross-sectional area can be chosen via the structure containing Sn. As a result, very high proportions of the surface of $Nb_3Sn$ can be attained in the finished superconducting wire, wherein an overall high current-carrying capacity of the superconducting wire can be achieved. It must be noted, however, that due to application requirements, a certain minimum proportion of Cu stabilization of the cross-sectional area, for example, at least 10%, preferably a 17-25% Cu proportion, must be provided. The Cu stabilization is usually separated from the reactive surface (or the reactive area) by a diffusion barrier.

Typically, the enclosures containing Cu essentially consist only of Cu and Sn so that overall they contain a content of no more than 2% by weight, preferably no more than 1% by weight, especially preferably no more than 0.5% by weight of other elements. As a rule, the Sn content in the enclosures containing Cu is between 2% by weight and 4% by weight; in this range, very good cold workability is possible, while sufficient Sn is present for considerably accelerated Sn diffusion to the Nb rods during the reaction heat treatment. The matrix containing Cu is usually manufactured from elemental copper. The structure containing Sn can either be solid or in powder form; it usually contains elemental Sn and is disposed centrally in the semi-finished wire. % by weight is a proportion of the weight expressed as a percentage.

PREFERRED EMBODIMENTS OF THE INVENTION

In an advantageous embodiment of the inventive semi-finished wire, the Sn content in the enclosures containing Cu of the elements containing Nb is at least 0.5% by weight, preferably at least 1% by weight, especially preferably at least 2% by weight. These in contents have been proven in practice and are sufficient to accelerate Sn transport considerably even during the initial phase of the reaction heat treatment.

Equally advantageous is an embodiment in which the content of Sn in the enclosures containing Cu of the elements containing Nb is no more than 25% by weight, preferably no more than 5% by weight, especially preferably no more than 4% by weight. Essentially, a smaller Sn content is associated with better mechanical properties, especially, better cold workability of the enclosures containing Cu. With a content of 5% by weight of Sn or less, bronze materials with good homogeneity are commercially available. With a Sn content of 5% by weight or less, moreover, cold workability that is sufficient for most drawing processes can be achieved, with 4% by weight, around 84%, and with 2% by weight, around 90%; these values are comparable with those for the cold workability of elemental copper. If the Sn content is sufficiently low, intermediate annealing during the manufacture of a $Nb_3Sn$ superconducting wire from the inventive semi-finished wire can usually be dispensed with entirely.

An embodiment is also preferred in which the matrix containing Cu also contains Sn, especially wherein the Sn content of the matrix containing Cu is equal to or less than that of the enclosures containing Cu.

By additionally enriching the matrix containing Cu with Sn, the diffusion of Sn from the structure containing Sn to the Nb rods can be further accelerated. The matrix containing Cu can be used as a Sn diffusion path immediately (as soon as reaction heat treatment starts); it is not necessary to wait for Sn to penetrate the matrix containing Cu from the structure containing Sn. In this way the treatment time of the reaction heat treatment can also be reduced and the grain interface density in the $Nb_3Sn$ kept high. Typically, the matrix containing Cu contains no more than 4% by weight of Sn, preferably no more than 2% by weight of Sn, especially preferably no more than 1% by weight of Sn; in this way, good cold workability can be ensured, which is especially important due to the usually relatively high proportion of the matrix containing Cu in the cross-sectional area of the semi-finished wire. Alternatively, the matrix containing Cu can be free of Sn or almost free of Sn (with a Sn content of 0.1% by weight or less); in this way the cold workability of the semi-finished wire can be improved.

In an advantageous embodiment, the elements containing Nb can be constituted as hexagonal elements with a hexagonal cross-section perpendicular to the longitudinal direction of the semi-finished product. Such hexagonal elements are easy to handle and pack densely against each other, wherein they make contact over a large surface area without gaps.

Equally advantageous is an embodiment in which the structure containing Sn is disposed centrally in the semi-finished wire, and the elements containing Nb packed against each other surround the structure containing Sn to form a closed ring. This enables even diffusion of Sn out of the structure containing Sn into the elements containing Nb.

In a preferred embodiment, the semi-finished wire has a Cu enclosing tube and a diffusion barrier for Cu and Sn, wherein the diffusion barrier for Cu and Sn is constituted inside the Cu enclosing tube, and the elements containing Nb which are packed against each other, the structure containing Sn and the matrix containing Cu are disposed inside the diffusion barrier for Cu and Sn, especially wherein the diffusion barrier is constituted from Ta and/or Nb. The diffusion barrier prevents the electrical properties of the Cu stabilization in the subsequent superconducting wire from deteriorating.

In a preferred further embodiment, additional structures containing Sn are provided, which are disposed between the elements containing Nb packed against each other and the diffusion barrier for Cu and Sn. Tin can also diffuse from the radially outer side into the elements containing Nb via the additional structures containing Sn, in particular, when the structure containing Sn is disposed centrally and is surrounded by the elements containing Nb forming a closed ring. In this way, the diffusion paths for Sn are shortened so that a faster reaction heat treatment and a correspondingly larger grain interface density can be achieved. In general, the Sn content in the additional structures containing Sn is equal to that in the enclosures containing Cu of the elements containing Nb or higher. The additional structures containing Sn can, in particular (similarly to the structure containing Sn) be constituted with a high in content and then typically contain at least 20% by weight of Sn, preferably at least 50% by weight of Sn, especially preferably at least 80% by weight of Sn, highly preferably at least 95% by weight of Sn. In particular, the additional structures containing Sn can be constituted as a composite material.

In an advantageous further variant of this embodiment, the additional structures containing Sn are constituted as sectional elements shaped to fit the bundle configuration. Typically, the shaped sectional elements complement the cross-section of the semi-finished wire between the outside contour of the elements containing Nb packed against each other ("bundle configuration") and the diffusion barrier. The shaped sectional elements can be placed onto the elements containing Nb packed against each other over a large surface area, which eases handling and avoids cavities. In the case of hexagonal elements containing Nb, sectional elements that have been appropriately shaped can be used.

An embodiment is preferred in which the structure containing Sn contains at least 20% by weight of Sn, preferably at least 50% by weight of Sn, especially preferably at least 80% by weight of Sn, highly preferably at least 95% by weight of Sn. In the case of high Sn contents, more Sn is available for the conversion of Nb to $Nb_3Sn$, in particular, by comparison with the bronze route. In a corresponding way, larger cross-sectional areas of the subsequent superconducting wire can also be filled with $Nb_3Sn$. In particular, the structure containing Sn can be constituted as a composite material.

An embodiment is also preferred according to which the rods containing Nb contain at least 50% by weight of Nb, preferably at least 80% by weight of Nb, especially preferably 100% by weight of Nb. With high Nb contents, more Nb is available for conversion during the reaction with Sn, which forms $Nb_3Sn$. In turn, larger cross-sectional areas of the subsequent superconducting wire can then also be filled with $Nb_3Sn$.

This invention also includes a method for manufacturing a $Nb_3Sn$ superconducting wire, which is characterized in that one or more inventive semi-finished wires described above are subjected to reaction heat treatment, in which Sn diffuses at least out of the structure containing Sn and the enclosures containing Cu to the rods containing Nb, and together with the Nb of the rods containing Nb reacts to form $Nb_3Sn$. Due to the Sn content in the enclosures containing Cu surrounding the Nb rods, the reaction heat treatment can be kept especially short (even before heating the semi-finished wire), as it is not necessary to wait for the first diffusion of Sn into the enclosures containing Cu. Typically, the main part of the reaction heat treatment is performed at a temperature in the range 600-725° C.

In a preferred variant of the inventive method, the reaction heat treatment is performed in such a way that the resulting $Nb_3Sn$ grains have a grain size distribution with a d50 value of 100 nm or less, in particular, wherein, at least for the diameters d of all resulting $Nb_3Sn$ grains, with the exception of a proportion of 10% by volume of the $Nb_3Sn$ grains having the smallest diameters and a proportion of 10% by volume of the $Nb_3Sn$ grains having the largest diameters, $200\ nm \geq d \geq 30\ nm$, preferably $150\ nm \geq d \geq 30\ nm$. In this way, a high grain interface density is achieved, wherein flux pinning is strengthened. Accordingly, especially high critical current densities and high critical flux densities (a high critical "B field") can be achieved in the superconducting wire. The grain size distribution and grain growth can be controlled, in particular, by the duration of the reaction heat treatment and also by the heating and cooling rates. Because, due to the composition of the semi-finished wire, relatively short treatment times are enough for complete or almost complete conversion of the Nb contained in the semi-finished wire to $Nb_3Sn$, the specified grain size distributions can be easily achieved for the usual dimensions of $Nb_3Sn$ superconducting wires. Typically, reaction heat treatment is inventively conducted in such a way that at least 70%, preferably at least 90%, and especially preferably at least 95% of the Nb content is converted to $Nb_3Sn$; in particular, the treatment can be terminated as soon as a desired proportion (typically between 90% and 99%) of the contained Nb has been converted. % by volume is a proportion of the volume expressed as a percentage. The grain size distribution can be determined by means of a micrograph.

A variant method is particularly preferred in which one or more semi-finished wires are subjected to a drawing process before the reaction heat treatment. Equally preferred is a variant method in which multiple semi-finished wires are inserted into a bundling tube and subjected to a drawing process before the reaction heat treatment. If a suitable Sn content in the enclosures containing Cu around the elements containing Nb of the semi-finished wire(s) is chosen, the inventive material containing Sn of the enclosures containing Cu does not noticeably impair the drawing process. For drawing processes, a Sn content of 5% by weight or less, preferably 4% by weight or less, has proven particularly suitable. Before the drawing process, multiple semi-finished wires can be bundled so that they are in particular rectangular, hexagonal, and/or circular. It is also possible to perform multiple bundling steps before the reaction heat treatment. Annealing of the semi-finished wire is preferably dispensed with entirely in manufacturing the superconducting wire.

The scope of this invention also includes a $Nb_3Sn$ superconducting wire, manufactured according to an inventive method described above. With a superconducting wire of this kind, especially high current-carrying capacities can be achieved.

Further advantages result from the description and the drawing. Moreover, the features stated above and further below can be used inventively singly or together in any combination. The embodiments shown and described are not intended to be an exhaustive list but are rather examples to explain the invention.

DETAILED DESCRIPTION OF THE INVENTION AND DRAWING

Figure 2:
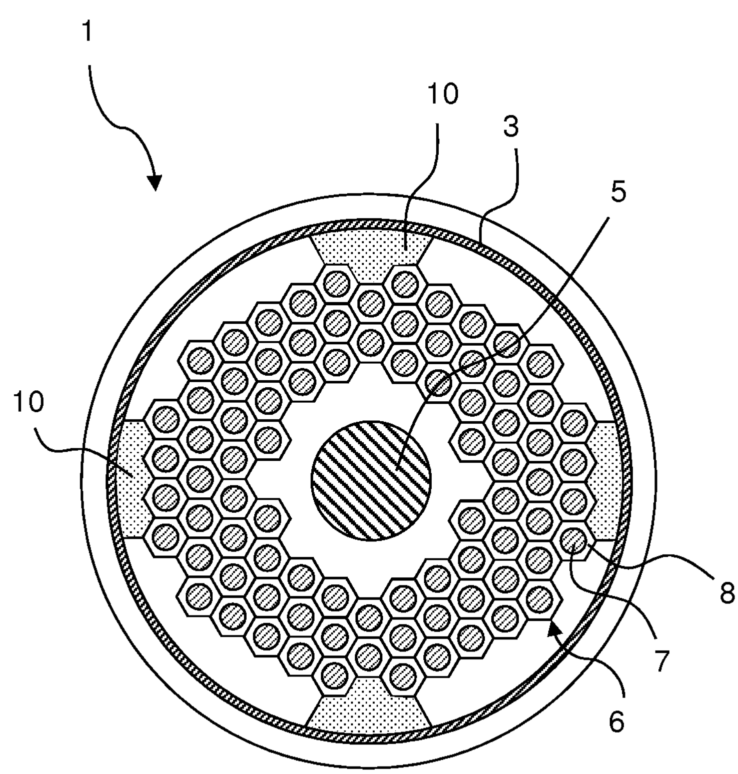
Figure 3:
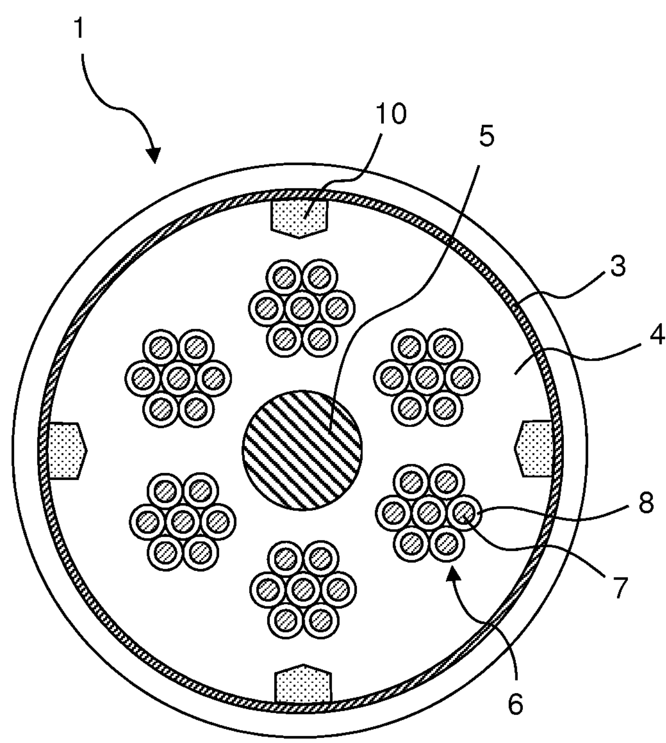

The invention is shown in the drawing and is explained in more detail using the example of the embodiments. The figures show:

FIG. 1 a schematic representation of a first embodiment of an inventive semi-finished wire, in cross-section perpendicular to the longitudinal direction of the semi-finished wire, with hexagonal elements containing Nb packed against each other in a ring-shaped fashion;

FIG. 2 a schematic representation of a second embodiment of an inventive semi-finished wire, in cross-section perpendicular to the longitudinal direction of the semi-finished wire, with hexagonal elements containing Nb packed against each other in a ring-shaped fashion and additional structures containing Sn;

FIG. 3 a schematic representation of a third embodiment of an inventive semi-finished wire, in cross-section perpendicular to the longitudinal direction of the semi-finished wire, with multiple groups of circular elements containing Nb packed against each other and additional structures containing Sn, FIG. 4 a schematic sequence of a variant for manufacturing a $Nb_3Sn$ superconducting wire according to the invention.

FIG. 1 shows a schematic cross-section of an inventive semi-finished wire 1 for a $Nb_3Sn$ superconducting wire, perpendicular to the longitudinal direction of the semi-finished wire 1.

A matrix 4 containing Cu is disposed in a Cu enclosing tube 2, which is provided on its inner side with a diffusion barrier 3 made of niobium. Here, a structure 5 containing Sn is disposed in the center of the matrix 4 containing Cu. The structure 5 containing Sn may, for example, be a powder made of elemental Sn, which is pressed into a hole in the matrix 4 containing Cu, or a rod made of an alloy with a high in content.

The semi-finished wire 1 furthermore comprises a multiplicity of elements 6 containing Nb, which are disposed packed against each other (contiguous) and, in this case, together form a ring-shaped configuration. The configuration of elements 6 containing Nb borders radially inwardly on matrix 4; the configuration borders radially outwardly on an additional matrix 9, which provides interposing support between this and the enclosing tube 2. The additional matrix 9 typically comprises elemental copper or the same material as the matrix 4 containing Cu.

Here, the elements 6 containing Nb are disposed hexagonally in cross-section. Each element 6 containing Nb comprises a rod 7 containing Nb and an enclosure 8 containing Cu, which in cross-section surrounds the rod 7 containing Nb. A rod 7 containing Nb is typically manufactured from elemental niobium or form an alloy with a high niobium content.

According to the invention, Sn is also contained in the enclosures 8 containing Cu of the elements 6 containing Nb, here with a proportion of 2% by weight. Additionally, the matrix 4 containing Cu can also contain Sn, for example, also 2% by weight of Sn.

If, during a reaction heat treatment, Sn is to diffuse out of the structure 5 containing Sn into the Nb rods 7, the Sn must initially pass through the matrix 4 containing Cu and the enclosures 8 containing Cu. If the enclosures containing Cu and possibly also the matrix 4 containing Cu already contain Sn, conversion of Nb in the Nb rods 7 can begin earlier and a high speed of reaction can be achieved more quickly. In particular, the enrichment of the enclosures 8 containing Cu improves access by Sn to elements 6 containing Nb that do not border onto the matrix 4 containing Cu.

In general, the following preferred conditions apply to the inventive semi-finished wires: Preferably, the proportion of the surface with Nb inside and including the diffusion barrier 3 is in the range 20% to 70%, especially preferably 35% to 60%. Furthermore, the surface ratio of Nb to Sn inside and including the diffusion barrier 3 is preferably in the range of 1.3 to 2.5, in particular, preferably 1.6 to 2. For the elements containing Nb, in each case a surface proportion ratio of the enclosure containing Cu to the Nb rod is preferably in the range of 0.1 to 1.5, especially preferably 0.1 to 0.5. Immediately before the reaction heat treatment, the diameter of Nb rods (Nb filaments) is preferably in the range of between 3 μm and 40 μm, especially preferably between 3 μm and 30 μm, and the thickness of the diffusion barrier is in the range of preferably 5 μm to 25 μm, especially preferably 10 μm to 15 μm.

FIG. 2 shows a second embodiment of an inventive semi-finished wire 1, which largely corresponds to the embodiment of FIG. 1. For that reason, only the essential differences are presented below.

Here, semi-finished wire 1 comprises not only the central structure 5 containing Sn but also further sources of Sn, namely additional structures 10 containing Sn. These additional structures 10 containing Sn are disposed radially between the ring-shaped configuration of elements 6 containing Nb and the diffusion barrier 3. In the illustrated embodiment, the additional structures 10 containing Sn are manufactured from an alloy containing tin, for example, Pb-free soft solder. Sn can diffuse through the additional structures 10 containing Sn to the elements 6 containing Nb not only from radially inside (via the structure 5 containing Sn), but also from radially outside. As a result, above all the Nb rods 7 of element 6 containing Nb located radially further outside can be more quickly converted to $Nb_3Sn$.

In the illustrated embodiment, the additional structures 10 containing Sn are constituted as shaped sectional elements, which are contiguous with the hexagonal elements 6 containing Nb, resulting in especially short diffusion paths of Sn from the additional structures 10 containing Sn to the elements 6 containing Nb. As the enclosures 8 containing Cu are already enriched with Sn, diffusion paths filled with Sn that start at the additional structures 10 containing Sn exist for the transport of Sn to all Nb rods 7 from the start of the reaction heat treatment.

FIG. 3 shows a third embodiment of an inventive semi-finished wire 1; again only the main differences over the previous embodiment are explained.

In this embodiment, multiple (in this case, six) groups of elements 6 containing Nb are embedded in the matrix 4 containing Cu, wherein in each group the elements 6 containing Nb are disposed packed against each other (contiguous). The elements 6 containing Nb each have a rod 7 containing Nb and an enclosure 8 containing Cu surrounding the latter, wherein the enclosure 8 containing Cu has a circular outside cross-section; alternatively, a hexagonal outside cross-section (similar to that illustrated in FIG. 1 and FIG. 2) is possible. According to the invention, the enclosures 8 containing Cu of the elements 6 containing Nb contain Sn.

Possible sources of Sn available besides the structure 5 containing Sn at the center of the semi-finished wire 1 are multiple additional structures 10 containing Sn. The additional structures 10 containing Sn are contiguous with the matrix 4 containing Cu, so that no direct contact exists between the additional structures 10 containing Sn and the elements 6 containing Nb. This simplifies joining of the semi-finished wire 1. The additional structures 10 containing Sn, on the other hand, are radially disposed between the elements 6 containing Nb and the diffusion barrier 3, in order also to be able to plentifully 4 supply the Nb rods 7 of the elements 6 containing Nb located radially further out with Sn.

FIG. 4 illustrates the manufacture of a $Nb_3Sn$ superconducting wire starting out from a semi-finished wire 1, as is shown by way of example in FIGS. 1, 2, and 3.

In the variant presented in FIG. 4, initially several inventive semi-finished wires 1, in which the enclosures containing Cu around the Nb rods are inventively enriched with Sn (cf. subfigure A), are bundled into a bundling tube (jacket tube) 40 (typically made of Cu) into a bundle 41 (cf. subfigure B). Then this bundle 41 is subjected to a drawing process, in which the diameter of the bundle 41 shrinks but the length of the bundle 41 increases (cf. subfigure C). If the content of Sn in the enclosures containing Cu or in the matrix containing Cu is suitable (preferably between 2 and 5% by weight of Sn), the semi-finished wires 1 contained in the bundle 41 can without problem participate in the plastic deformation (cold working) that the drawing process involves. If required, multiple bundling and drawing processes can be performed alternately one after the other.

The desired superconducting application can be prepared with a bundle drawn in this way, which can also be designated bundle wire 42. Here, the bundle wire 42 is laid in the geometry in which a superconducting wire is required. In the illustrated variant, a solenoid coil 43 is wound with the bundle wire 42 (cf. subfigure D).

Finally, the prepared superconducting wire application, here the wound solenoid coil 43, is subjected to reaction heat treatment; in the illustrated example, the solenoid coil 43 is disposed in an oven 44 for this purpose (cf. subfigure E). During the reaction heat treatment, Sn in particular diffuses out of the structure containing Sn into the Nb rods of the semi-finished wires, wherein because the enclosures containing Cu are already enriched with Sn (and possibly a matrix containing Cu enriched with Sn and/or additional structures containing Sn), a relatively short reaction heat treatment time can be chosen. By this means, a $Nb_3Sn$ superconducting wire 45 with especially small $Nb_3Sn$ grains can be obtained from the bundle wire, which has a particularly high superconducting current-carrying capacity.

$Nb_3Sn$ superconducting wires manufactured according to the inventive method can be used, for example, for superconducting magnets in nuclear magnetic resonance (NMR), in particular, for very high magnetic field NMR magnets (of $B_0 \geq 10$ Tesla, preferably $B_0 \geq 15$ Tesla), or also for superconducting dipole magnets as are used for particle accelerators or fusion power plants.

The invention claimed is:

1. A semi-finished wire for an $Nb_3Sn$ superconducting wire, the semi-finished wire being processed into the $Nb_3Sn$ superconducting wire by subjecting the semi-finished wire to a reaction heat treatment, wherein the semi-finished wire comprises the following elements, the structure of which is hereby recited prior to application of that reaction heat treatment:

a multiplicity of elements containing Nb packed against each other, said elements containing Nb each having a rod containing Nb and an enclosure containing Cu which surrounds said rod containing Nb, wherein said enclosures containing Cu of said elements containing Nb, contain Sn;

a structure containing Sn; and a matrix containing Cu in which said structure containing Sn is disposed and on or in which said elements containing Nb are disposed.

2. The semi-finished wire of claim 1, wherein a content of Sn in said enclosures containing Cu of said elements containing Nb is at least 0.5% by weight, at least 1% by weight or at least 2% by weight.

3. The semi-finished wire of claim 1, wherein a content of Sn in said enclosures containing Cu of said elements containing Nb is no more than 25% by weight, no more than 5% by weight or no more than 4% by weight.

4. The semi-finished wire of claim 1, wherein said matrix containing Cu also contains Sn, wherein a Sn content in said matrix containing Cu is equal to or less than that of said enclosures containing Cu.

5. The semi-finished wire of claim 4, wherein said matrix containing Cu also contains Sn, wherein a Sn content in said matrix containing Cu is equal to or less than that of said enclosures containing Cu.

6. The semi-finished wire of claim 1, wherein said elements containing Nb are constituted as hexagonal elements with a hexagonal cross-section perpendicular to a longitudinal direction of the semi-finished wire.

7. The semi-finished wire of claim 1, wherein said structure containing Sn is disposed centrally in the semi-finished wire and said elements containing Nb packed against each other surround said structure containing Sn to form a closed ring.

8. The semi-finished wire of claim 1, wherein the semi-finished wire further comprises a Cu enclosing tube and a diffusion barrier for Cu and Sn, with said diffusion barrier for Cu and Sn being disposed inside said Cu enclosing tube, wherein said elements containing Nb which are packed against each other, said structure containing Sn and said matrix containing Cu are disposed inside said diffusion barrier for Cu and Sn.

9. The semi-finished wire of claim 8, wherein said diffusion barrier is constituted from Ta or Nb.

10. The semi-finished wire of claim 8, further comprising additional structures containing Sn, said additional structures being disposed between said elements containing Nb packed against each other and said diffusion barrier for Cu and Sn.

11. The semi-finished wire of claim 10, wherein said additional structures containing Sn are constituted as shaped sectional elements adapted to a bundle configuration.

12. The semi-finished wire of claim 1, wherein said structure containing Sn contains at least 20% by weight of Sn, at least 50% by weight of Sn, at least 80% by weight of Sn or at least 95% by weight of Sn.

13. The semi-finished wire of claim 1, wherein said rods containing Nb contain at least 50% by weight of Nb, at least 80% by weight of Nb or 100% by weight of Nb.

14. A method for producing an $Nb_3Sn$ superconducting wire from a semi-finished wire, the method comprising the steps of:

a) packing a multiplicity of elements containing Nb against each other, the elements containing Nb each having a rod containing Nb and an enclosure containing Cu which surrounds said rod containing Nb, wherein said enclosures containing Cu of said elements containing Nb, contain Sn;

b) preparing a matrix containing Cu;

c) disposing a structure containing Sn on or in the matrix containing Cu;

d) disposing the elements containing Nb on or in the matrix containing Cu; and e) subjecting, following steps a) to d), the semi-finished wire to a reaction heat treatment in which Sn diffuses at least out of said structure containing Sn and said enclosures containing Cu to said rods containing Nb and reacts with Nb of said rods containing Nb to form $Nb_3Sn$.

15. The method of claim 14, wherein the reaction heat treatment is performed in such a way that resulting $Nb_3Sn$ grains have a grain size distribution with a d50 value of 100 nm or less.

16. The method of claim 15, wherein at least for diameters d of all resulting $Nb_3Sn$ grains, with an exception of a proportion of 10% by volume of $Nb_3Sn$ grains having smallest diameters and a proportion of 10% by volume of $Nb_3Sn$ grains having largest diameters, 200 nm$\geq$d$\geq$30 nm or 150 nm$\geq$d$\geq$30 nm.

17. The method of claim 14, wherein one or more semi-finished wires are subjected to a drawing process before the reaction heat treatment.

18. The method of claim 14, wherein multiple semi-finished wires are inserted into a bundling tube and are subjected to a drawing process before the reaction heat treatment.

19. A $Nb_3Sn$ superconducting wire manufactured according to the method of claim 14.

20. A semi-finished wire for an $Nb_3Sn$ superconducting wire, the semi-finished wire comprising:

a multiplicity of elements containing Nb packed against each other, said elements containing Nb each having a rod containing Nb and an enclosure containing bronze which surrounds said rod containing Nb;

a structure containing Sn; and a matrix containing Cu in which said structure containing Sn is disposed and on or in which said elements containing Nb are disposed.

* * * * *